(12) United States Patent
Niimura et al.

(10) Patent No.: US 9,653,595 B2
(45) Date of Patent: May 16, 2017

(54) SEMICONDUCTOR DEVICE AND SEMICONDUCTOR DEVICE FABRICATION METHOD (71) Applicant: FUJI ELECTRIC CO., LTD., Kawasaki-shi (JP)

(72) Inventors: Yasushi Niimura, Matsumoto (JP); Toshiaki Sakata, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/482,742

(22) Filed: Sep. 10, 2014

(65) Prior Publication Data
US 2014/0374819 A1 Dec. 25, 2014

Related U.S. Application Data (63) Continuation of application No. PCT/JP2013/068439, filed on Jul. 4, 2013.

(30) Foreign Application Priority Data

Jul. 19, 2012 (JP) .................................. 2012-160658

(51) Int. Cl.
*H01L 29/78* (2006.01)
*H01L 29/06* (2006.01)
(Continued)

(52) U.S. Cl.
CPC ........ *H01L 29/7802* (2013.01); *H01L 21/266* (2013.01); *H01L 29/0634* (2013.01);
(Continued)

(58) Field of Classification Search
None
See application file for complete search history.

(56) References Cited

U.S. PATENT DOCUMENTS 5,216,275 A 6/1993 Chen
5,438,215 A 8/1995 Tihanyi
(Continued)

FOREIGN PATENT DOCUMENTS

JP 09-266311 A 10/1997
JP 2006-066421 A 3/2006
(Continued)

OTHER PUBLICATIONS

International Search Report, dated Oct. 8, 2013, issued in PCT/JP2013/068439. English translation provided.

*Primary Examiner* — William Coleman
*Assistant Examiner* — Kien Ly
(74) *Attorney, Agent, or Firm* — Rossi, Kimms & McDowell LLP (57) ABSTRACT An n⁻ drift layer is a parallel pn layer having an n-type region and a p-type region are alternately arranged in the direction parallel to the main surface so as to come into contact with each other, and have a width in a direction parallel to the main surface of the substrate which is less than a length in a direction perpendicular to the main surface of the substrate. A second-main-surface-side lower end portion of the p-type region has a structure in which a high-concentration lower end portion and a low-concentration lower end portion of a p-type low-concentration region are repeated at a predetermined pitch in the direction parallel to the main surface of the substrate. It is possible to provide a super junction MOS semiconductor device which can improve a trade-off relationship between turn-off loss and turn-off dv/dt and improve avalanche resistance.

7 Claims, 7 Drawing Sheets (51) Int. Cl.
    *H01L 29/10*      (2006.01)
    *H01L 29/36*      (2006.01)
    *H01L 29/739*     (2006.01)
    *H01L 21/266*     (2006.01)
    *H01L 29/66*      (2006.01)
    *H01L 29/08*      (2006.01)

(52) U.S. Cl.
    CPC ...... *H01L 29/0696* (2013.01); *H01L 29/0878* (2013.01); *H01L 29/0886* (2013.01); *H01L 29/1095* (2013.01); *H01L 29/36* (2013.01); *H01L 29/66348* (2013.01); *H01L 29/66712* (2013.01); *H01L 29/7395* (2013.01); *H01L 29/7827* (2013.01)

(56) References Cited

U.S. PATENT DOCUMENTS

| | | | |
|---|---|---|---|
| 6,097,063 A | 8/2000 | Fujihira | |
| 6,475,864 B1 * | 11/2002 | Sato | H01L 29/0634 257/E21.418 |
| 6,551,909 B1 * | 4/2003 | Fujihira | H01L 29/0619 257/E21.383 |
| 6,700,141 B2 * | 3/2004 | Iwamoto | H01L 29/7802 257/110 |
| 2003/0122222 A1 * | 7/2003 | Okumura | H01L 29/0634 257/653 |
| 2006/0043481 A1 | 3/2006 | Yamashita et al. | |
| 2007/0272977 A1 * | 11/2007 | Saito | H01L 29/0634 257/329 |
| 2008/0135930 A1 * | 6/2008 | Saito | H01L 29/0634 257/330 |
| 2008/0237774 A1 | 10/2008 | Ono et al. | |
| 2009/0001460 A1 * | 1/2009 | Saggio | H01L 29/0634 257/341 |
| 2009/0273031 A1 * | 11/2009 | Saito | H01L 29/0634 257/339 |
| 2010/0308399 A1 * | 12/2010 | Saito | H01L 29/0634 257/329 |
| 2010/0308401 A1 * | 12/2010 | Narazaki | H01L 29/4236 257/330 |
| 2011/0018055 A1 * | 1/2011 | Ohta | H01L 29/0634 257/329 |
| 2011/0101446 A1 * | 5/2011 | Guan | H01L 29/0634 257/329 |
| 2011/0291181 A1 | 12/2011 | Irifune et al. | |
| 2013/0026560 A1 | 1/2013 | Onishi et al. | |

FOREIGN PATENT DOCUMENTS

| | | | |
|---|---|---|---|
| JP | 2008-091450 A | | 4/2008 |
| JP | 2009-188177 A | | 8/2009 |
| JP | 2011-003609 A | | 1/2011 |
| JP | 2011-003729 A | | 1/2011 |
| JP | 2011003609 A | * | 1/2011 |
| JP | 2011-249712 A | | 12/2011 |
| WO | 2011/093473 A1 | | 8/2011 |

* cited by examiner

SEMICONDUCTOR DEVICE AND SEMICONDUCTOR DEVICE FABRICATION METHOD

BACKGROUND OF THE INVENTION

A. Field of the Invention

The present invention relates to a semiconductor device and a semiconductor device fabrication method.

B. Description of the Related Art

In a general planar n-channel vertical metal oxide semiconductor field effect transistor (MOSFET: insulated gate field effect transistor), among a plurality of semiconductor layers formed in a semiconductor substrate, an $n^-$ drift layer is a semiconductor layer with the highest resistance. When the thickness of the $n^-$ drift layer is reduced to shorten a current path, the resistance of the semiconductor layer with high resistance is reduced. Therefore, the overall on-resistance of the MOSFET is substantially reduced.

However, in the off state of the MOSFET, a depletion layer spreads to the $n^-$ drift layer with high resistance and the breakdown voltage is maintained by the spreading of the depletion layer. Therefore, when the thickness of the $n^-$ drift layer is reduced, the spreading of the depletion layer is reduced and electric field intensity is likely to reach a critical value at a low applied voltage. As a result, the breakdown voltage is reduced. In contrast, a MOSFET with a high breakdown voltage requires a thick $n^-$ drift layer. Therefore, on-resistance increases and electrical connection loss increases. The relationship between the on-resistance and the breakdown voltage is called a trade-off relation. In general, it is difficult to increase the on-resistance and the breakdown voltage having the trade-off relationship therebetween.

It has been known that there also is a trade-off relationship between the on-resistance and the breakdown voltage in a bipolar power semiconductor device, such as an insulated gate bipolar transistor (IGBT), a bipolar transistor, or a diode. As a device which improves the trade-off relationship to increase the on-resistance and to increase the breakdown voltage, a semiconductor device with a super junction (SJ) structure (hereinafter, referred to as a super junction semiconductor device) has been proposed in which a drift layer is a parallel pn layer in which a n-type region and a p-type region with high impurity concentration are alternately arranged.

Figure 11:
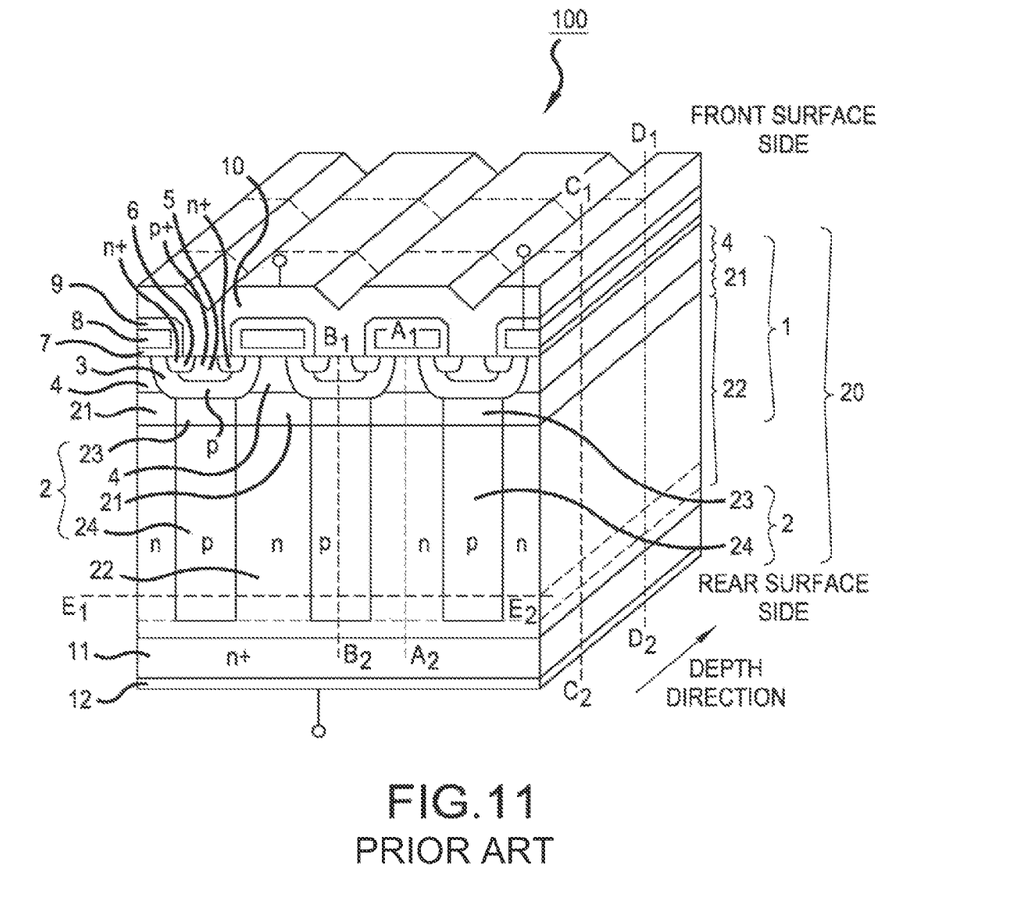
FIG. 11 is a perspective view illustrating the structure of a super junction MOSFET according to the related art.

FIG. 11 illustrates a portion of a super junction MOSFET 100 as an example of the super junction semiconductor device. FIG. 11 is a perspective view illustrating the structure of the super junction MOSFET according to the related art. Hereinafter, the structure of the super junction MOSFET 100 according to the related art will be described. The super junction MOSFET 100 according to the related art includes a drift layer with a higher impurity concentration than a drift layer of a general MOSFET which has the same breakdown voltage as the super junction MOSFET 100. The drift layer is a parallel pn layer 20 having the following structure: an n-type region 1 and a p-type region 2, in which a width in a direction parallel to the main surface of a substrate is less than a length (depth) in a direction perpendicular to the main surface of the substrate, are alternately arranged in the direction parallel to the main surface of the substrate so as to come into contact with each other; and a plurality of pn junctions formed between the two regions are arranged in the direction perpendicular to the main surface of the substrate. The width of the n-type region 1 and the p-type region 2 is set to a value which enables a depletion layer to be spread from the pn junction into each region when a low reverse bias voltage (100 V to 200 V) is applied to the pn junction between the two regions.

The super junction MOSFET 100 has the same layer structure as a general MOSFET except for the parallel pn layer 20. In the layer structure, for example, a p base region 3, an n-type surface region 4, a $p^+$ contact region 5, an $n^+$ source region 6, a gate insulating film 7, a gate electrode 8, an interlayer insulating film 9, and a source electrode 10 are provided as a front-surface-side structure. A drain electrode 12 which comes into contact with a $n^+$ drain layer 11 is provided as a rear-surface-side structure (for example, see U.S. Pat. No. 5,216,275 (FIGS. 1 to 5), U.S. Pat. No. 5,438,215 (FIG. 1), and JP 9-266311 A (FIGS. 7 to 9)). As illustrated in FIG. 11, the n-type region 1 forming the parallel pn layer 20 is obtained by laminating an n-type low-concentration region 22, an n-type high-concentration region 21, and an n-type surface region 4 from the rear surface. Similarly, the p-type region 2 is obtained by laminating a p-type low-concentration region 24 and a p-type high-concentration region 23 from the rear surface.

Figure 2:
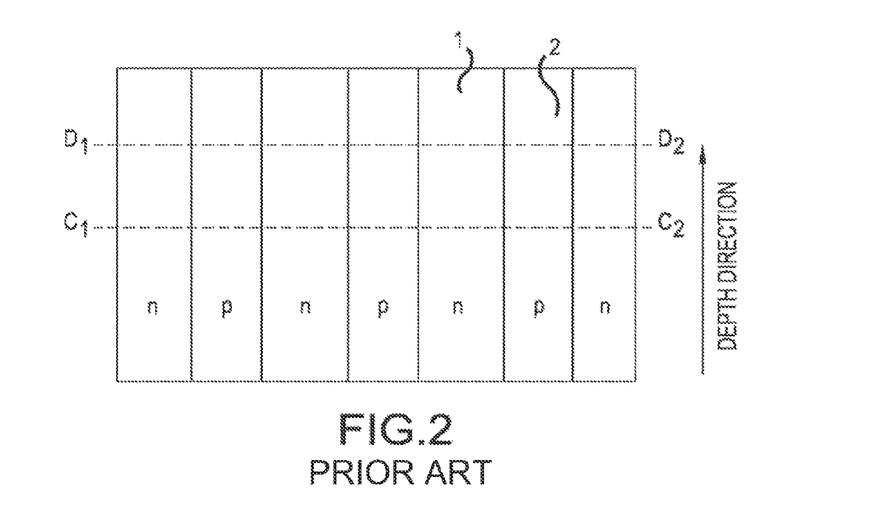
FIG. 2 is a plan view illustrating a planar pattern in a cut surface when a lower end portion of a parallel pn layer illustrated in FIG. 11 is cut along the line $E_1$-$E_2$ parallel to the main surface of a substrate.

FIG. 2 is a plan view illustrating a planar pattern in a cut surface when a lower end portion of the parallel pn layer illustrated in FIG. 11 (a portion of the parallel pn layer 20 close to the rear surface of the substrate) is cut along the line $E_1$-$E_2$ parallel to the main surface of the substrate. FIG. 2 illustrates that the n-type region 1 and the p-type region 2 of the parallel pn layer 20 are formed in parallel with the same pattern width in the depth direction of the plane of paper which is not illustrated in FIG. 11.

Figure 3:
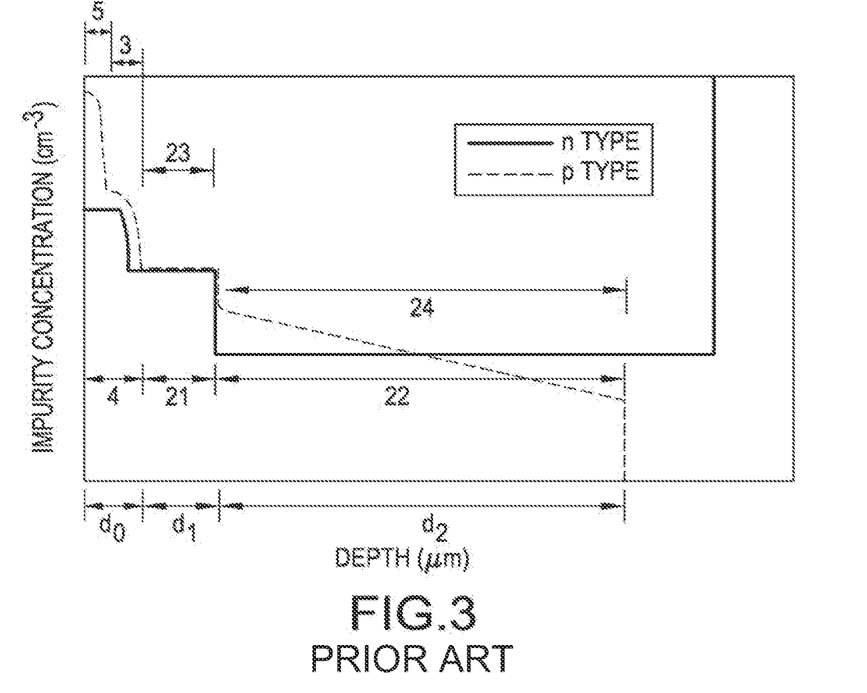
FIG. 3 is a characteristic diagram illustrating an impurity concentration distribution in a cut surface taken along the line $C_1$-$C_2$ and the line $D_1$-$D_2$ of FIG. 11.

FIG. 3 is a characteristic diagram illustrating an impurity concentration distribution in a cut surface taken along the line $C_1$-$C_2$ and the line $D_1$-$D_2$ of FIG. 11. The cut surface taken along the line $C_1$-$C_2$ and the line $D_1$-$D_2$ is perpendicular to the main surface of the substrate and the depth direction of the plane of paper. The impurity concentration distribution of the n-type region (solid line) illustrated in FIG. 3 is an n-type impurity concentration distribution in a direction which is perpendicular to the main surface of the substrate and corresponds to the line $A_1$-$A_2$ of FIG. 11. The impurity concentration distribution of the p-type region (dotted line) illustrated in FIG. 3 is a p-type impurity concentration distribution in a depth direction from the front surface of a semiconductor substrate which corresponds to the line $B_1$-$B_2$ of FIG. 11.

In FIG. 3, the vertical axis indicates an impurity concentration and the horizontal axis indicates the depth from the front surface of the substrate. In FIG. 3, a first depth $d_0$ is the depth from the upper end of the p base region 3 (the front surface of the substrate) to the bottom of the p base region 3 (an interface between the p base region 3 and the p-type high-concentration region 23). The p-type impurity concentration distribution up to the first depth $d_0$ from the front surface of the substrate is a two-stage p-type impurity concentration distribution (dotted line) of the first $p^+$ contact region 5 and the p base region 3. A second depth $d_1$ is the depth from the bottom of the p base region 3 to the lower end (an end close to the rear surface of the substrate, that is, an interface between the n-type high-concentration region 21 and the n-type low-concentration region 22) of the n-type high-concentration region 21 adjacent to the p-type high-concentration region 23 which is a layer below the p base region 3 (a layer close to the rear surface of the substrate). A third depth $d_2$ is the depth to the lower end (an end close to the rear surface of the substrate) of the p-type low-concentration region 24 which is arranged at the lower end of the n-type high-concentration region 21.

As illustrated in FIG. 3, in the n-type impurity concentration distribution (solid line) along the line $A_1$-$A_2$, the impurity concentration distribution of the n-type low-concentration region 22 below the lower end of the n-type high-concentration region 21 is the same as the impurity concentration distribution of the original semiconductor substrate and is uniform. However, the impurity concentration distribution may have gradient impurity concentration. The original semiconductor substrate means a semiconductor substrate before the parallel pn layer 20 is formed. In addition, the n-type high-concentration region 21 and the n-type surface region 4 are formed as layers (layers close to the front surface of the substrate) above the n-type low-concentration region 22. As such, it is preferable that the n-type region 1 have a three-stage impurity concentration distribution in which the n-type low-concentration region 22, the n-type high-concentration region 21, and the n-type surface region 4 have different impurity concentrations. In the three-stage impurity concentration distribution, preferably, the n-type low-concentration region 22, which is the lowest layer of the n-type region 1, has the lowest impurity concentration, followed by the n-type high-concentration region 21 and the n-type surface region 4. The n-type high-concentration region 21 and the n-type surface region 4 may have the same impurity concentration.

As described above, the p-type impurity concentration distribution (dotted line) along the line $B_1$-$B_2$ is a four-stage impurity concentration distribution including the two-stage impurity concentration distribution of the $p^+$ contact region 5 and the p base region 3 and the two-stage impurity concentration distribution of the p-type high-concentration region 23 which is represented by the second depth $d_1$ from the bottom of the p base region 3 and the p-type low-concentration region 24 which is represented by the third depth $d_2$ from the lower end of the p-type high-concentration region 23. In this case, as illustrated in FIG. 3, it is desirable that the p-type high-concentration region 23 which is represented by the second depth $d_1$ from the bottom of the p base region 3 have a higher high impurity concentration than the p-type low-concentration region 24 which is represented by the third depth $d_2$ from the lower end of the p-type high-concentration region 23 (the lower end of the n-type high-concentration region 21). As illustrated in FIGS. 3 and 11, it is preferable that a region which includes the $p^+$ contact region 5 and the p base region 3 and is represented by the first depth $d_0$ from the front surface of the substrate be deeper than the n-type surface region 4.

In the super junction MOSFET 100 having the above-mentioned structure, even when the impurity concentration of the parallel pn layer 20 is higher than that of the drift layer of the general MOSFET that has the same breakdown voltage as the parallel pn layer 20, the depletion layer is spread from each pn junction, which extends in the vertical direction (the direction perpendicular to the main surface of the substrate) between the parallel pn layers 20, into each parallel pn layer 20 in the horizontal direction (the direction parallel to the main surface of the substrate) at a low breakdown voltage in an off state and the entire drift layer is rapidly depleted. Therefore, it is possible to increase the breakdown voltage. In addition, since the drift layer has high impurity concentration, on-resistance is reduced.

In many cases, the power MOSFET is used as a switching device. Therefore, both electrical connection loss which occurs in an on state and switching loss which occurs during switching need to be reduced. One of the main causes of an increase in switching loss is turn-off loss. For example, the time rate of change of the drain voltage (hereinafter, referred to as turn-off dv/dt) when the semiconductor device is turned off may increase to reduce the turn-off loss. However, when the turn-off dv/dt increases, noise is likely to be generated. It is necessary to reduce the turn-off dv/dt in order to reduce noise. As such, the trade-off relationship is generally established between the turn-off loss and the turn-off dv/dt.

For example, when the turn-off dv/dt is 10 kV/μs at which no noise is generated, the turn-off loss is about 0.5 mJ in the super junction MOSFET according to the related art and is about 0.1 mJ in the general MOSFET. That is, in the super junction MOSFET according to the related art, the deterioration of the trade-off relationship between the turn-off loss and the turn-off dv/dt is about five times more than that in the general MOSFET according to the related art. Therefore, for example, even though on-resistance can be reduced to about one fifth, the effect of reducing total loss by the super junction MOSFET is substantially cancelled. As such, in the super junction MOSFET according to the related art, even when the trade-off relationship between the on-resistance and the breakdown voltage can be improved, the trade-off relationship between the turn-off loss and the turn-off dv/dt deteriorates.

In the super junction MOSFET according to the related art, in the case in which the charge balance of the parallel pn layer is under the charge balance condition that the breakdown voltage is at the highest level, when an avalanche current between the drain and the source increases, the drain voltage is reduced. Therefore, when an avalanche occurs, negative resistance is generated and the avalanche current is likely to be locally concentrated. As a result, avalanche current breakdown resistance (hereinafter, referred to as avalanche resistance) is reduced. In order to solve the problem, a technique has been known in which a p-type region forming a parallel pn layer is provided closer to the rear surface of a substrate than an n-type region forming the parallel pn layer and the amount of p-type impurities on the front surface side of the parallel pn layer is more than the amount of n-type impurities, thereby reducing the negative resistance of current-voltage during avalanche and improving avalanche resistance (for example, see PCT International Publication No. WO 2011-93473 (paragraphs 0021 and 0022)).

In addition, a technique has been proposed which relates to a reduction in avalanche resistance due to the turn-on of a parasitic bipolar transistor in a super junction MOSFET according to the related art (for example, see the following JP 2011-3609 A (paragraph 0004)). Furthermore, the following has been proposed in which, in the super junction MOSFET according to the related art, when a reverse bias is applied to a pn junction, a large amount of avalanche current flows and negative resistance is generated, which results in a reduction in avalanche resistance (for example, see JP 2009-188177 A (paragraph 0013)).

As another structure of the super junction MOSFET according to the related art, the following structure has been proposed. The impurity concentration of a p-type region and an n-type region of a parallel pn layer increases stepwise from the rear surface of a substrate in a substantially vertical direction (to the front surface of the substrate). In particular, when the impurity concentration of the p-type region and the n-type region of the parallel pn layer increases in three or more steps in the substantially vertical direction, a semiconductor element with low on-resistance and a high breakdown voltage is obtained. In addition, the impurity concentration of the p-type region and the n-type region of the parallel pn layer is not changed stepwise, but may be changed continuously or in a wave shape in the depth direction (the direction perpendicular to the main surface of the substrate). The impurity concentration of the p-type region and the lower end of the n-type region of the parallel pn layer is preferably higher than that of an n⁻ semiconductor layer (drift layer) (for example, see JP 2008-91450 A (paragraph 0017)).

As another structure of the super junction MOSFET according to the related art, the following structure has been proposed. A charge unbalance margin means that the amount of charge represented by the product of the carrier concentration and width of an n-type region of a parallel pn layer is equal to the amount of charge represented by the product of the carrier concentration and width of a p-type region of the parallel pn layer. In other words, the charge unbalance margin is the design allowable values of the carrier concentration and width of the p-type region and the n-type region of the parallel pn layer in the range in which the breakdown voltage is not reduced, with respect to deviation from the ideal amount of charge of the parallel pn layer which can completely deplete the parallel pn layer. A technique has been proposed in which the charge unbalance margin is preferably equal to or greater than ±15%, considering various variations in a process of fabricating a power MOSFET (for example, see JP 2006-66421 A (paragraphs 0010 and 0011)).

When the parallel pn layer forming the drift layer of the super junction MOSFET has the structure disclosed in the above-mentioned PCT International Publication No. WO 2011-93473, it is possible to prevent the generation of negative resistance and positive resistance characteristics are obtained as in the general MOSFET including a single drift layer. Therefore, avalanche resistance is improved. However, in the structure disclosed in the above-mentioned PCT International Publication No. WO 2011-93473, a portion with high electric field intensity is distributed along each pn junction between the parallel pn layers in the super junction structure. In addition, a p base region 3, an n⁺ source region 6, and a p⁺ contact region 5 are provided immediately above (on the front surface side of the substrate) the parallel pn layer in a stripe shape that extends along the same direction as the direction in which the stripe pattern of the pn junction of the parallel pn layer extends. Therefore, when an avalanche current flows through the p-type base region 3, it flows to a source electrode 10 through the vicinity of a portion which is arranged immediately below the n⁺ source region 6 (the vicinity of a portion of the p-type base region 3 interposed between the n⁺ source region 6 and the p-type region 2). As a result, the avalanche current becomes a base current of the parasitic bipolar transistor (the n-type surface region 4-the p-type base region 3-the n⁺ source region 6 in FIG. 11) and the parasitic bipolar transistor operates and is likely to be broken.

The invention has been made in order to solve the above-mentioned problems and an object of the invention is to provide a semiconductor device and a semiconductor device fabrication method which can improve avalanche resistance.

SUMMARY OF THE INVENTION

In order to solve the above-mentioned problems, a semiconductor device according to an aspect of the invention has the following characteristics. A metal-oxide oxide film-semiconductor insulated gate structure is provided on a first main surface of a first-conductivity-type semiconductor substrate. A drift layer is provided between the first main surface of the first-conductivity-type semiconductor substrate and a second main surface opposite to the first main surface. The drift layer is a parallel pn layer including a first-conductivity-type region in which a width in a direction parallel to the first main surface is less than a length in a direction perpendicular to the first main surface and a second-conductivity-type region in which a width in the direction parallel to the first main surface is less than a length in the direction perpendicular to the first main surface. The first-conductivity-type region and the second-conductivity-type region are alternately arranged in the direction parallel to the first main surface so as to come into contact with each other. A pn junction between the first-conductivity-type region and the second-conductivity-type region extends in the direction perpendicular to the first main surface. A second-conductivity-type second-main-surface-side region having an impurity concentration distribution in which high impurity concentration and low impurity concentration are repeated at a predetermined pitch in the direction parallel to the first main surface and in a second direction perpendicular to a first direction in which the first-conductivity-type region and the second-conductivity-type region are arranged in a line is provided at an end of the second-conductivity-type region which is close to the second main surface.

In the semiconductor device according to the above-mentioned aspect of the invention, the second-main-surface-side region may include: a second-main-surface-side high-concentration region that has a higher impurity concentration than the end of the second-conductivity-type region close to the second main surface and has a larger width than the second-conductivity-type region in the first direction; and a second-main-surface-side low-concentration region that has a lower impurity concentration than the end of the second-conductivity-type region close to the second main surface and has a smaller width than the second-conductivity-type region in the first direction. The second-main-surface-side high-concentration region and the second-main-surface-side low-concentration region may be alternately and continuously arranged in the second direction.

In the semiconductor device according to the above-mentioned aspect of the invention, the predetermined pitch may be less than a pitch between the first-conductivity-type region and the second-conductivity-type region.

In order to solve the above-mentioned problems, a method for fabricating the semiconductor device according to the above-mentioned aspect includes a forming step of performing ion implantation using a mask having a stripe-shaped opening portion which extends in the second direction to form the second-main-surface-side region. The opening portion of the mask has a stripe pattern in which a first opening portion that exposes a portion corresponding to a region for forming the second-main-surface-side high-concentration region and a second opening portion that exposes a portion corresponding to a region for forming the second-main-surface-side low-concentration region and has a smaller opening area than the first opening portion are alternately arranged in an extension direction of the stripe.

According to the semiconductor device and the semiconductor device fabrication method of the invention, the area ratio for operating the parasitic bipolar transistor is reduced. Therefore, it is possible to improve avalanche resistance.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Hereinafter, preferred embodiments of a semiconductor device and a semiconductor device fabrication method according to the invention will be described in detail with reference to the accompanying drawings. In the specification and the accompanying drawings, in the layers or regions having "n" or "p" appended thereto, an electron or a hole means a majority carrier. In addition, symbols "+" and "−" added to n or p mean that impurity concentration is higher and lower than that of the layer without the symbols. In the description of the following embodiment and the accompanying drawings, the same components are denoted by the same reference numerals and the description thereof will not be repeated. In the following description, a first conductivity type is an n type and a second conductivity type is a p type. In addition, a first main surface is a front surface and a second main surface is a rear surface.

Embodiment 1

Figure 1:
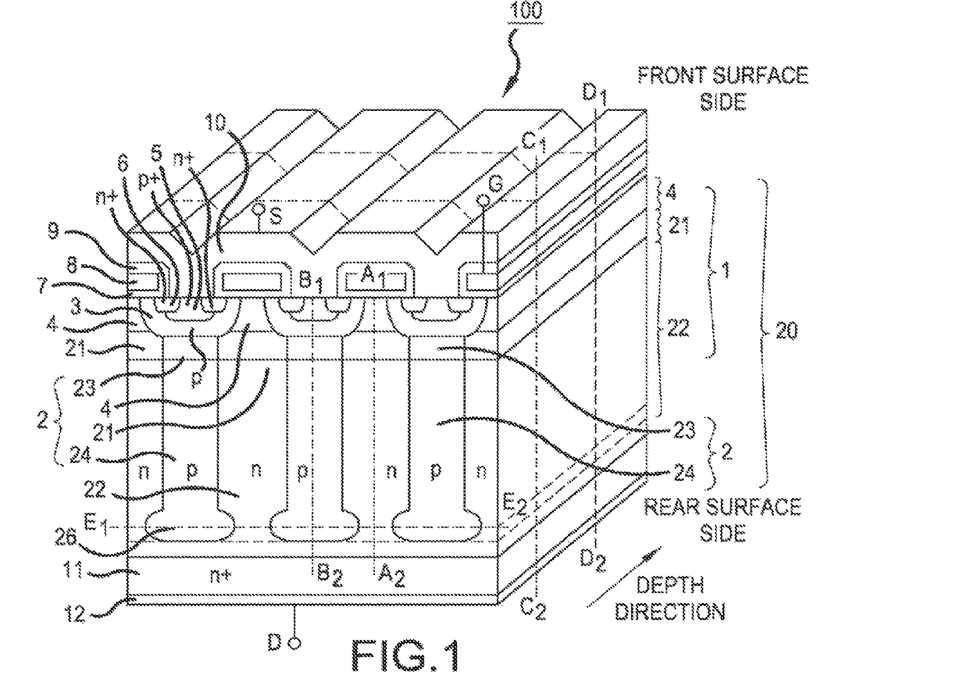
FIG. 1 is a perspective view illustrating the structure of a super junction MOSFET according to Embodiment 1 of the invention.

A super junction MOSFET will be described as an example of a super junction MOS semiconductor device according to Embodiment 1 of the invention. FIG. 1 is a perspective view illustrating the structure of the super junction MOSFET according to Embodiment 1 of the invention. As illustrated in FIG. 1, in a super junction MOSFET 100 according to Embodiment 1, a MOS gate (metal-oxide film-semiconductor insulated gate) structure is provided on the first main surface (front surface) side of a semiconductor substrate (an epitaxial substrate which will be described below) and an n$^+$ drain layer 11 and a drain electrode 12 are provided on the second main surface (rear surface) side. The front surface structure of a planar MOSFET including the MOS gate structure includes, for example, a p base region 3, an n-type surface region 4, a p$^+$ contact region 5, an n$^+$ source region 6, a gate insulating film 7, a gate electrode 8, an interlayer insulating film 9, and a source electrode 10.

A parallel pn layer 20 is provided as a drift layer between the MOS gate structure provided on the front surface side of the semiconductor substrate and the n$^+$ drain layer 11 provided on the rear surface side. The parallel pn layer 20 has the following structure: an n-type region 1 and a p-type region 2, in which a length (depth) in a direction perpendicular to the main surface of a substrate is greater than a width in a direction parallel to the main surface of the substrate, are alternately arranged in the direction parallel to the main surface of the substrate so as to come into contact with each other; and a plurality of pn junctions formed between the two regions are arranged in the direction perpendicular to the main surface of the substrate. The parallel pn layer 20 has a structure in which the n-type region 1 and the p-type region 2 that extend in the direction perpendicular to the front surface of the substrate are alternately arranged in the direction parallel to the front surface of the substrate. The pn junction between the n-type region 1 and the p-type region 2 is formed in the drift layer so as to extend in the direction vertical to (perpendicular to) the front surface of the substrate. The p-type region 2 is set to a length (depth) that does not reach the n$^+$ drain layer 11 provided on the rear surface side of the substrate.

The planar pattern of the n-type region 1 and the p-type region 2 (a planar pattern (hereinafter, referred to as the planar pattern of the parallel pn layer 20) when the cut surface of the parallel pn layer 20 taken in the direction parallel to the front surface of the substrate is viewed from the upper side (front surface side)) is a stripe pattern that extends in a direction (the depth direction of the plane of paper) perpendicular to the direction in which the n-type region 1 and the p-type region 2 are arranged in a line. The planar pattern of the parallel pn layer 20 includes a stripe pattern with a straight line shape (hereinafter, referred to as a straight stripe pattern) which is provided on the front surface side of the substrate and a stripe pattern with a curve shape (hereinafter, referred to as a curved stripe pattern) which is provided in a lower end portion on the rear surface side of the substrate. The planar pattern of the parallel pn layer 20 is repeatedly continuous in the depth direction of the plane of paper represented by an arrow in FIG. 1.

The p base region 3 in the front surface structure of the MOSFET comes into contact with the upper end (an end close to the front surface of the substrate) of the p-type region 2 and is provided in a surface layer of the front surface of the semiconductor substrate along the pattern of the p-type region 2. The outermost surface which is close to the front surface of the substrate in the n-type region 1 adjacent to the p-type region 2 is the n-type surface region 4. Since the n-type surface region 4 is disposed between adjacent p base regions 3, the n-type surface region 4 and the p base region 3 are adjacent to each other in the front surface of the semiconductor substrate. An n-type high-concentration region 21 is provided at the lower end (the end close to the rear surface of the substrate) of the n-type surface region 4 so as to come into contact with the n-type surface region 4.

The n-type surface region 4 may have a higher impurity concentration than the n-type high-concentration region 21 or it may have the same impurity concentration as the n-type high-concentration region 21. When the n-type surface region 4 and the n-type high-concentration region 21 have the same impurity concentration, the n-type surface region 4 can have the same depth as the p base region 3. When the n-type surface region 4 has a higher impurity concentration than the n-type high-concentration region 21, the n-type impurity concentration of a portion of the p base region 3 which is disposed in the vicinity of the corner of the bottom (the rear surface side of the substrate) can increase to a value that is equal to the impurity concentration of a p-type high-concentration region 23 which comes into contact with the bottom of the p base region 3. Therefore, it is preferable that the depth of the n-type surface region 4 from the front surface of the substrate be less than the depth of the p base region 3 from the front surface of the substrate. According to this structure, it is possible to prevent the electric field from being concentrated on the vicinity of the corner of the bottom of the p base region 3 and to prevent a reduction in the breakdown voltage.

The $p^+$ contact region 5 and the $n^+$ source region 6 are selectively provided in the p base region 3 so as to be exposed from the front surface of the substrate. In addition, the $p^+$ contact region 5 and the $n^+$ source region 6 are adjacent to each other in the front surface of the substrate. The gate electrode 8 is formed above the $n^+$ source region 6, the $p^+$ contact region 5, and the n-type region 1 (n-type surface region 4), with the gate insulating film 7 interposed therebetween. The source electrode 10 comes into contact with the $p^+$ contact region 5 and the $n^+$ source region 6 such that the $p^+$ contact region 5 is short-circuited to the $n^+$ source region 6 in the front surface of the substrate. In addition, the source electrode 10 is insulated from the gate electrode 8 by the interlayer insulating film 9.

An n-type low-concentration region 22 is provided at the lower end of the n-type high-concentration region 21 so as to come into contact with the n-type high-concentration region 21. The n-type high-concentration region 21 and the n-type low-concentration region 22 form the n-type region 1. The n-type low-concentration region 22 has a uniform impurity concentration distribution and the lower end of the n-type low-concentration region 22 comes into contact with the $n^+$ drain layer 11. A p-type low-concentration region 24 is provided at the lower end of the p-type high-concentration region 23 so as to come into contact with the p-type high-concentration region 23. The p-type high-concentration region 23 and the p-type low-concentration region 24 form the p-type region 2.

The p-type low-concentration region 24 has an impurity concentration distribution in which impurity concentration is reduced from the front surface to the rear surface of the substrate, except for a lower end portion 26 provided on the rear surface side of the substrate, and has a depth that does not reach the $n^+$ drain layer 11. The n-type low-concentration region 22 is interposed between the p-type low-concentration region 24 and the $n^+$ drain layer 11. The lower end portion 26 of the p-type low-concentration region 24 includes a lower end portion 26a (FIG. 5) which has a higher impurity concentration than a portion that comes into contact with the p-type low-concentration region 24 and a lower end portion 26b (FIG. 6) which has a lower impurity concentration than the portion that comes into contact with the p-type low-concentration region 24.

Figure 4:
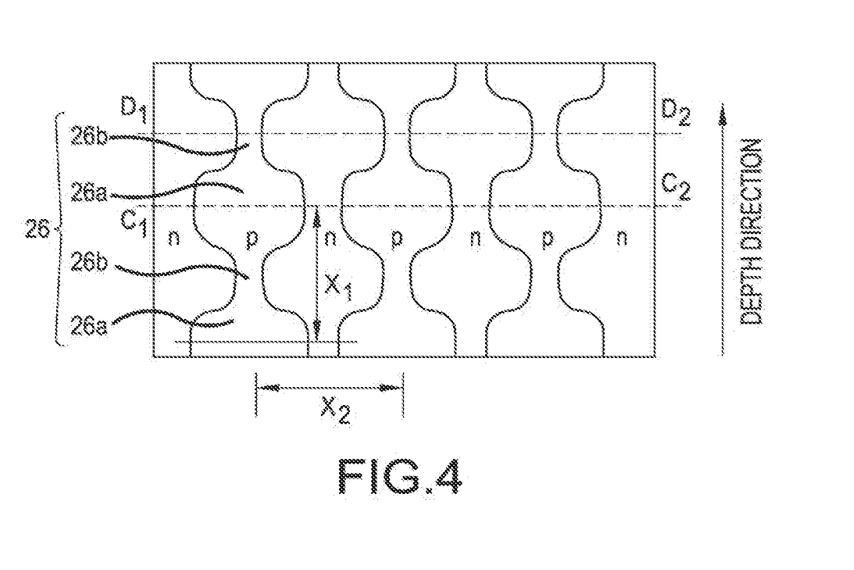
FIG. 4 is a plan view illustrating a planar pattern in a cut surface when a lower end portion of a parallel pn layer illustrated in FIG. 1 is cut along the line $E_1$-$E_2$ parallel to the main surface of a substrate.

FIG. 4 is a plan view illustrating a planar pattern in a cut surface when the lower end portion of the parallel pn layer illustrated in FIG. 1 is cut along the line $E_1$-$E_2$ parallel to the main surface of the substrate. Specifically, as illustrated in FIG. 4, the width (the width in the direction perpendicular to the depth direction of the plane of paper; hereinafter, simply referred to as a width) of the high-concentration lower end portion 26a of the p-type low-concentration region 24 is greater than that of the n-type regions 1 which are arranged at equal intervals in the general straight stripe pattern illustrated in FIG. 2 (convex portion). In addition, the width of the low-concentration lower end portion 26b of the p-type low-concentration region 24 is less than that of the n-type regions 1 which are arranged at equal intervals in the general straight stripe pattern (concave portion).

The high-concentration lower end portion 26a and the low-concentration lower end portion 26b of the p-type low-concentration region 24 are alternately and continuously arranged in the depth direction of the plane of paper and in the direction parallel to the main surface of the substrate. Therefore, the planar pattern of the lower end portion of the parallel pn layer 20 as viewed from the main surface side of the substrate (upper side) is a curved stripe pattern with a curved edge.

Figure 5:
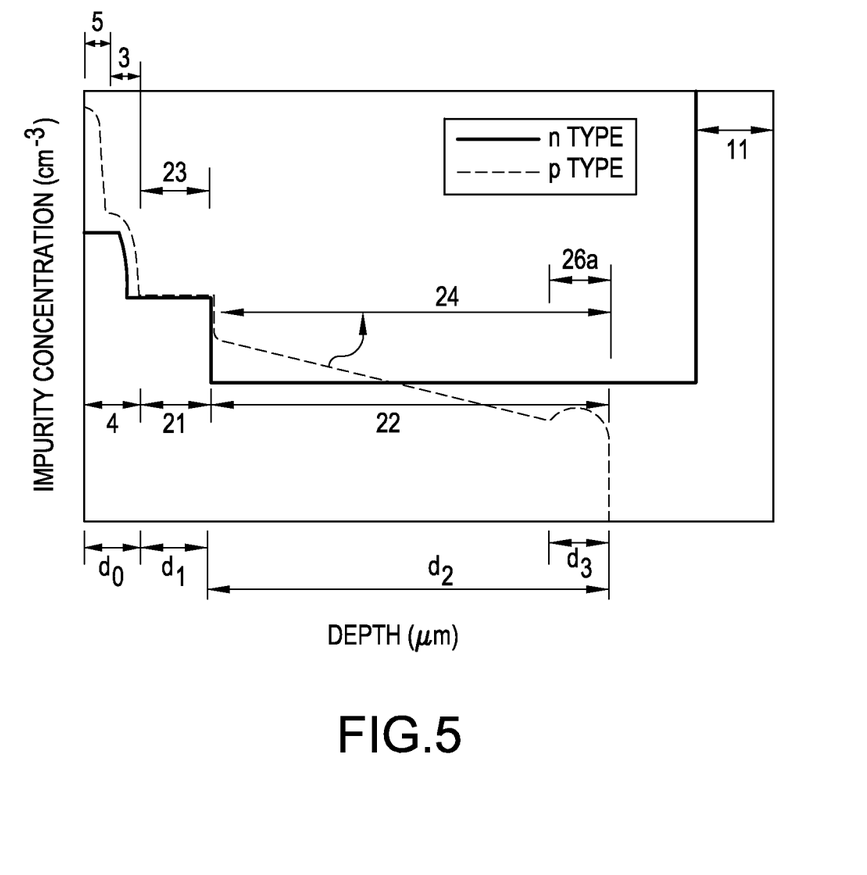
FIG. 5 is a characteristic diagram illustrating an impurity concentration distribution in a cut surface taken along the line $C_1$-$C_2$ of FIG. 1.

Next, the n-type impurity concentration distribution of the n-type region 1 and the p-type impurity concentration distribution of the p base region 3 and the p-type region 2 will be described. FIG. 5 is a characteristic diagram illustrating the impurity concentration distribution in the cut surface taken along the line $C_1$-$C_2$ of FIG. 1. The cut surface taken along the line $C_1$-$C_2$ traverses the high-concentration lower end portion 26a of the p-type low-concentration region 24 so as to be perpendicular to the main surface of the substrate and the stripe pattern of the parallel pn layer 20 (which holds for FIG. 10). FIG. 5 illustrates the n-type impurity concentration distribution (solid line) along the line $A_1$-$A_2$ of FIG. 1 and the p-type impurity concentration distribution (dotted line) along the line $B_1$-$B_2$ of FIG. 1. The n-type impurity concentration distribution (solid line) illustrated in FIG. 5 is the impurity concentration distribution of the n-type region 1 in the depth direction from the surface (the front surface of the substrate) of the n-type surface region 4. The p-type impurity concentration distribution (dotted line) illustrated in FIG. 5 is the impurity concentration distribution of the p base region 3 and the p-type region 2 in the depth direction (the front surface of the substrate) of the $p^+$ contact region 5.

In the impurity concentration distribution illustrated in FIG. 5, a first depth $d_0$ corresponds to the thickness of the p base region 3 and is the depth from the front surface of the substrate to the interface between the p base region 3 and the p-type high-concentration region 23. The p-type impurity concentration distribution up to the first depth $d_0$ from the front surface of the substrate includes the two-stage impurity concentration distribution of the $p^+$ contact region 5 and the p base region 3. A second depth $d_1$ corresponds to the thickness of the p-type high-concentration region 23 and is equal to the depth from the bottom of the p base region 3 to the lower end (the end close to the rear surface of the substrate, that is, the interface between the n-type high-concentration region 21 and the n-type low-concentration region 22) of the n-type high-concentration region 21 adjacent to the p-type high-concentration region 23 which is a layer (a layer close to the rear surface of the substrate) below the p base region 3.

A third depth $d_2$ corresponds to the thickness of the p-type low-concentration region 24 and is the depth from the lower end of the n-type high-concentration region 21 to the lower end of the p-type region 2. In the cut surface taken along the line $C_1$-$C_2$, the high-concentration lower end portion 26a of the p-type low-concentration region 24, which is characteristic of the invention, is provided with a thickness corresponding to a fourth depth $d_3$ from the lower end of the p-type low-concentration region 24 in the direction of the front surface of the substrate in the p-type region 2. The n-type impurity concentration distribution illustrated in FIG. 5 is the impurity concentration distribution of the n-type surface region 4, the n-type high-concentration region 21, and the n-type low-concentration region 22 which are provided in this order from the front surface to the rear surface of the substrate. In the n-type impurity concentration distribution, the sum of the first depth $d_0$ and the second depth $d_1$ is the sum of the thickness of the n-type surface region 4 and the thickness of the n-type high-concentration region 21 and the third depth $d_2$ corresponds to the thickness of the n-type low-concentration region 22.

As illustrated in FIG. 5, the n-type region 1 has two different impurity concentration distributions of the n-type high-concentration region 21 and the n-type low-concentration region 22 which are sequentially formed in the direction from the bottom of the p base region 3 (the interface between the p base region 3 and the p-type high-concentration region 23) to the rear surface of the substrate. The impurity concentration of the n-type high-concentration region 21 may be equal to or greater than 1.2 times the impurity concentration of the n-type low-concentration region 22 and equal to or less than three times the impurity concentration of the n-type low-concentration region 22. Preferably, the impurity concentration of the n-type high-concentration region 21 may be equal to or less than 2.5 times the impurity concentration of the n-type low-concentration region 22. That is, the n-type region 1 has a larger amount of n-type impurities on the front surface side of the substrate. The impurity concentration of the n-type high-concentration region 21 may be, for example, $4.8 \times 10^{15}/cm^3$. The impurity concentration of the n-type low-concentration region 22 may be, for example, $3.0 \times 10^{15}/cm^3$.

Next, a planar pattern in a cut surface when the lower end portion 26 of the p-type low-concentration region 24, which is the lowest layer (a layer closest to the rear surface of the substrate) of the p-type region 2, is cut along the line $E_1$-$E_2$ parallel to the main surface of the substrate will be described with reference to FIG. 4. As illustrated in FIG. 4, the planar pattern of the lower end portion 26 of the p-type low-concentration region 24 is a curved stripe pattern in which a convex curve and a concave curve are repeated in the depth direction of the plane of paper. The p-type region 2 except for the lower end portion 26 of the p-type low-concentration region 24 has a straight stripe pattern with a uniform width, similarly to FIG. 2. As such, one of the reasons why the lower end portion 26 of the p-type low-concentration region 24 is formed in the curved stripe pattern is to keep a charge balance between the n-type region 1 and the p-type region 2 and another reason is to improve avalanche resistance. Therefore, the amount of impurities in a part (a convex portion of the curved stripe pattern) of the high-concentration lower end portion 26a of the p-type low-concentration region 24 is more than the amount of impurities in a part (a concave portion of the curved stripe pattern) of the low-concentration lower end portion 26b of the p-type low-concentration region 24.

For example, the following fabrication method may be used to fabricate the super junction MOSFET 100 including the parallel pn layer 20 so as to have the above-mentioned structure. First, a thin n-type epitaxial layer, which will be an n-type low-impurity layer between the p-type region 2 and the $n^+$ drain layer 11, is grown on the front surface of a supporting substrate, which will be the $n^+$ drain layer 11. In addition, a portion, which will be the lower end portion 26 of the p-type low-concentration region 24, is grown with a predetermined thickness (=the fourth depth $d_3$) on the n-type epitaxial layer. Then, a photoresist mask, in which stripe-shaped opening portions with different opening areas are formed such that convex and concave curves are formed in the depth direction of the plane of paper in which the stripe extends, is formed on the n-type epitaxial layer. Then, boron (B) ions are implanted, using the photoresist mask as a mask, to form the lower end portion 26 of the p-type low-concentration region 24 which has a curved stripe pattern with an impurity concentration difference.

Then, an n-type epitaxial layer with a desired drift layer thickness is grown. In this way, the epitaxial substrate obtained by growing the epitaxial layer on the supporting substrate, which will be the $n^+$ drain layer 11, is fabricated. Then, the n-type epitaxial layer on the lower end portion 26 of the p-type low-concentration region 24 is selectively removed and a trench with a straight stripe pattern that extends in a stripe shape in the depth direction of the plane of paper in which the curved stripe pattern of the lower end portion 26 of the p-type low-concentration region 24 extends is formed. Then, the p-type low-concentration region 24 (a portion other than the lower end portion 26) and the p-type high-concentration region 23, which will be the p-type region 2, are sequentially formed by, for example, a method of growing a p-type epitaxial layer in the trench to fill the trench. Then, the front surface structure and the drain electrode 12 of the planar MOSFET including the MOS gate structure are formed by a general method. In this way, the super junction MOSFET 100 illustrated in FIG. 1 is completed. The parallel pn layer 20 including the lower end portion which has a stripe shape and has a concentration difference between the impurity concentration of the n-type region 1 and the impurity concentration of the p-type region 2 can be formed by the above-mentioned fabrication method and the arrangement illustrated in FIG. 4.

The n-type region 1 may have three different impurity concentration distributions of the n-type surface region 4, the n-type high-concentration region 21, and the n-type low-concentration region 22. That is, as illustrated in the n-type impurity concentration distribution (solid line) of FIG. 5, the n-type region 1 has the three-stage impurity concentration distribution from the front surface to the rear surface of the substrate. The n-type low-concentration region 22 may not have uniform concentration, but may have gradient concentration, unlike FIG. 5. In this case, the impurity concentration of the n-type high-concentration region 21 including the n-type surface region 4 may be equal to or greater than 1.2 times the impurity concentration of the n-type low-concentration region 22 and equal to or less than three times the impurity concentration of the n-type low-concentration region 22. Preferably, the impurity concentration is equal to or less than 2.5 times the impurity concentration of the n-type low-concentration region 22.

Next, the p-type impurity concentration distribution will be described. The p-type impurity concentration distribution (dotted line) illustrated in FIG. 5 is the impurity concentration distribution of the p-type high-concentration region 23 and the p-type low-concentration region 24 forming the p-type region 2 (the second depth $d_1$+the third depth $d_2$) from the bottom of the p base region 3 (the first depth $d_0$ from the front surface of the substrate) to the rear surface of the substrate. The p-type high-concentration region 23 of the p-type region 2 which is close to the front surface of the substrate has uniform impurity concentration that is higher than the impurity concentration of the p-type low-concentration region 24. The p-type low-concentration region 24 of the p-type region 2 which is close to the rear surface of the substrate has an impurity concentration distribution in which impurity concentration is reduced from the front surface to the rear surface of the substrate. Preferably, the p-type low-concentration region 24 (dotted line) which has gradient impurity concentration has high impurity concentration that is in the range of +5% to +20% of the impurity concentration of the n-type low-concentration region 22 (solid line) on the high concentration side (the front surface side of the substrate) and has low impurity concentration that is in the range of −5% to −20% of the impurity concentration of the n-type low-concentration region 22 (solid line) on the low concentration side (the rear surface side of the substrate). The impurity concentration of the lower end portion 26 of the p-type low-concentration region 24 has been briefly described above and thus the description thereof will not be repeated.

Figure 6:
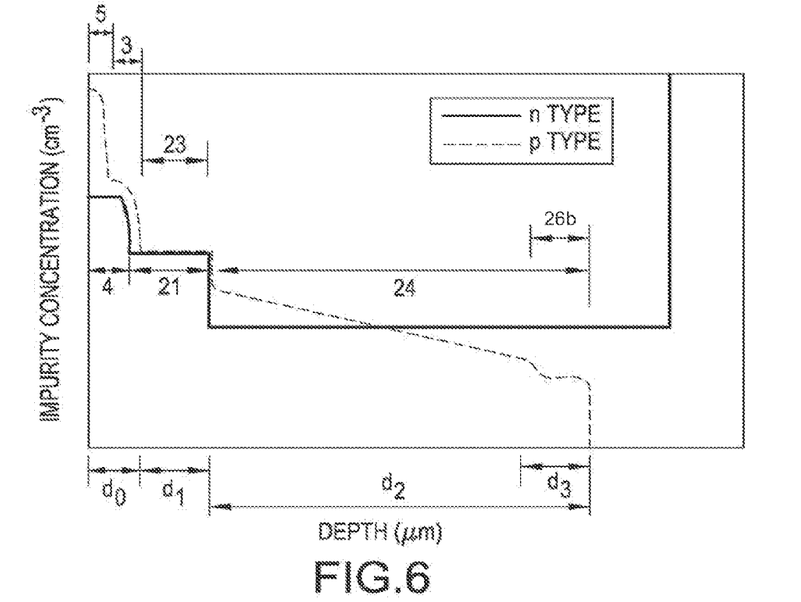
FIG. 6 is a characteristic diagram illustrating an impurity concentration distribution in a cut surface taken along the line $D_1$-$D_2$ of FIG. 1.

FIG. 6 is a characteristic diagram illustrating an impurity concentration distribution in a cut surface taken along the line $D_1$-$D_2$ of FIG. 1. The cut surface taken along the line $D_1$-$D_2$ traverses the low-concentration lower end portion 26b of the p-type low-concentration region 24 so as to be perpendicular to the main surface of the substrate and the stripe pattern of the parallel pn layer 20 (which holds for FIG. 9). FIG. 6 illustrates the n-type impurity concentration distribution (solid line) along the $A_1$-$A_2$ of FIG. 1 and the p-type impurity concentration distribution (dotted line) along the line $B_1$-$B_2$ of FIG. 1.

The impurity concentration distribution illustrated in FIG. 5 differs from the impurity concentration distribution illustrated in FIG. 6 in the impurity concentration of the lower end portion 26 of the p-type low-concentration region 24. As illustrated in FIG. 4, the width of the lower end portion 26 of the p-type low-concentration region 24 in the vicinity of the cut surface taken along the line $C_1$-$C_2$ is greater than the width of the lower end portion 26 of the p-type low-concentration region 24 in the vicinity of the cut surface taken along the line $D_1$-$D_2$. Therefore, an impurity concentration difference occurs. While the impurity concentration of the lower end portion 26 of the p-type low-concentration region 24 (the low-concentration lower end portion 26b of the p-type low-concentration region 24) in the vicinity of the cut surface taken along the line $D_1$-$D_2$ is low, the impurity concentration of the lower end portion 26 of the p-type low-concentration region 24 (the high-concentration lower end portion 26a of the p-type low-concentration region 24) in the vicinity of the cut surface taken along the line $C_1$-$C_2$ is high.

As described above, according to Embodiment 1, the lower end portion of the p-type region 2 (the lower end portion of the p-type low-concentration region), which is close to the rear surface of the substrate, has the impurity distribution in which a region with high p impurity concentration and a region with low p impurity concentration are periodically and alternately repeated in the direction parallel to the main surface of the substrate. Therefore, a portion with high p-type impurity concentration, into which an avalanche current starts to flow, is not provided in the entire p-type region of the parallel pn layer, but is selectively provided in the p-type region of the parallel pn layer. According to this structure, the path of the avalanche current along the parallel pn junction reaches the source electrode through the vicinity of a portion which is arranged immediately below the source region provided immediately above the p-type region (the vicinity of a portion of the p-type base region interposed between the $n^+$ source region and the p-type region) and an area ratio for operating a parasitic bipolar transistor is reduced. Therefore, it is possible to improve avalanche resistance. As a result, the trade-off relationship between turn-off loss and turn-off dv/dt is improved, as compared to the general MOSFET according to the related art.

Embodiment 2

Figure 7:
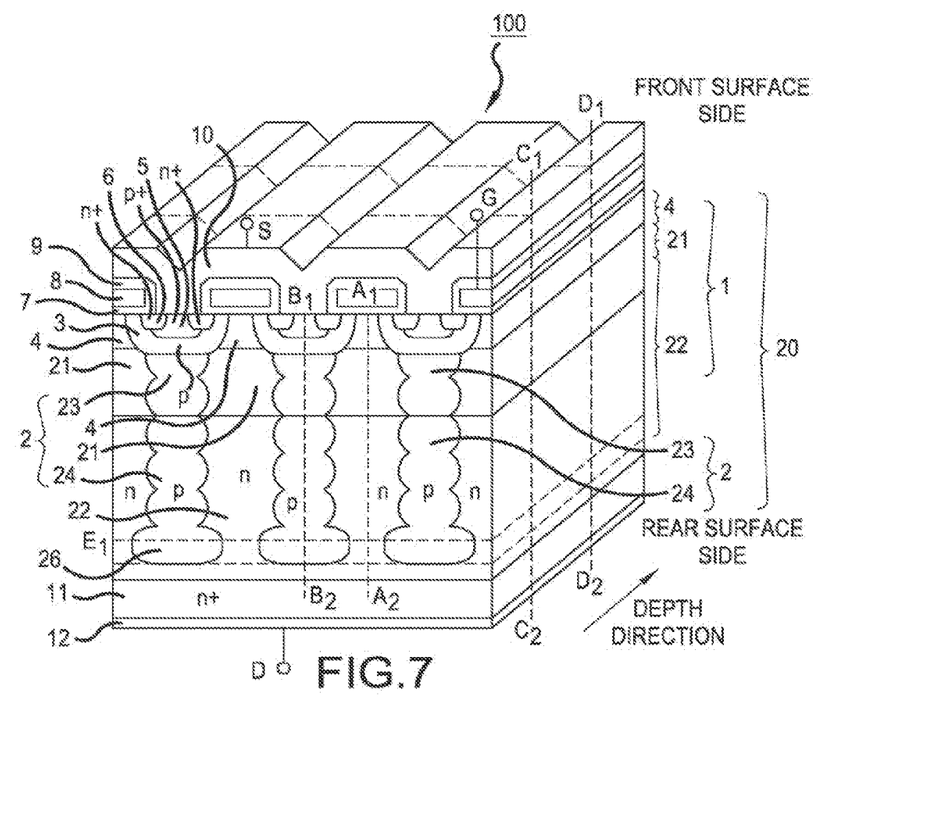
FIG. 7 is a perspective view illustrating the structure of a super junction MOSFET according to Embodiment 2 of the invention.

Next, a super junction MOSFET will be described as an example of a super junction MOS semiconductor device according to Embodiment 2 of the invention. FIG. 7 is a perspective view illustrating the structure of the super junction MOSFET according to Embodiment 2 of the invention. A parallel pn layer 20 of a super junction MOSFET 100 according to Embodiment 2 has a laminated structure of a plurality of epitaxial layers. In Embodiment 2, an n-type region 1 and a p-type region 2 forming the parallel pn layer 20 are formed as follows. Whenever an n-type epitaxial layer is grown, p-type impurity ions, such as boron ions, are implanted into the n-type epitaxial layer in order to form the p-type region 2 and the introduced p-type impurities are diffused to selectively form the p-type region 2 in the n-type epitaxial layer. A portion of the n-type epitaxial layer in which the p-type region 2 is not formed is the n-type region 1. For example, the parallel pn layer 20 having a pn junction surface with a substantial arc shape is laminated a plurality of times. The parallel pn layer 20 having a wave-shaped impurity concentration distribution (hereinafter, referred to as a wavy impurity concentration distribution) in the depth direction of a substrate is formed.

Figure 9:
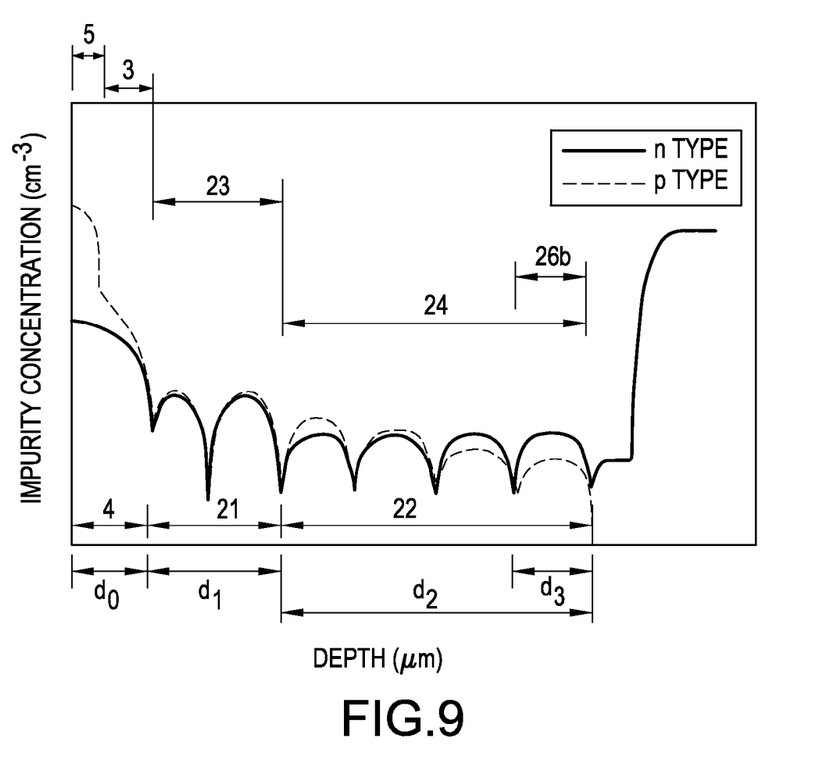
FIG. 9 is a characteristic diagram illustrating an impurity concentration distribution in a cut surface taken along the line $D_1$-$D_2$ of FIG. 7.
Figure 10:
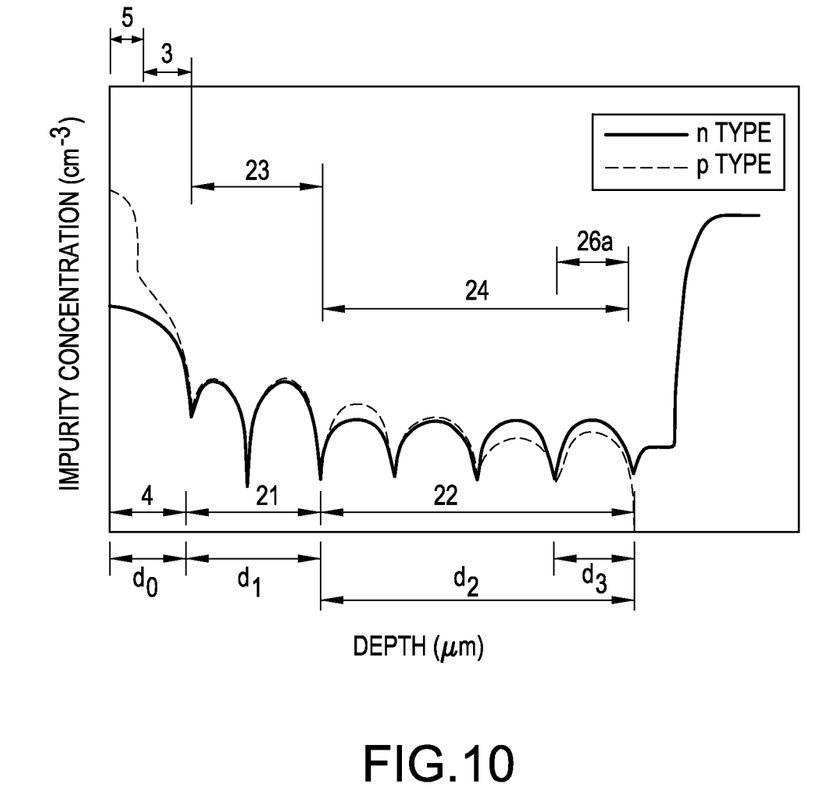
FIG. 10 is a characteristic diagram illustrating an impurity concentration distribution in a cut surface taken along the line $C_1$-$C_2$ of FIG. 7.

Next, the impurity concentration distributions of the n-type region 1 and the p-type region 2 will be described. FIG. 9 is a characteristic diagram illustrating an impurity concentration distribution in a cut surface taken along the line $D_1$-$D_2$ of FIG. 7. FIG. 9 illustrates an n-type impurity concentration distribution (solid line) corresponding to the line $A_1$-$A_2$ of FIG. 7 and a p-type impurity concentration distribution (dotted line) corresponding to the line $B_1$-$B_2$ of FIG. 7. FIG. 10 is a characteristic diagram illustrating an impurity concentration distribution in a cut surface taken along the line $C_1$-$C_2$ of FIG. 7. FIG. 10 illustrates an n-type impurity concentration distribution (solid line) corresponding to the line $A_1$-$A_2$ of FIG. 7 and a p-type impurity concentration distribution (dotted line) corresponding to the line $B_1$-$B_2$ of FIG. 7.

In FIGS. 9 and 10, the n-type impurity concentration distribution of the n-type region 1 along the line $A_1$-$A_2$ of FIG. 7 is the same as the n-type impurity concentration distribution (FIG. 5 and FIG. 6) in Embodiment 1 except that it has a wavy impurity concentration distribution shape based on a difference in the method of forming the parallel pn layer 20. That is, the n-type region 1 has a three-stage impurity concentration distribution of an n-type surface region 4, an n-type high-concentration region 21, and an n-type low-concentration region 22. The p-type region 2 has a two-stage impurity concentration distribution formed by a p-type high-concentration region 23 and a p-type low-concentration region 24 having an impurity concentration distribution in which impurity concentration is gradually reduced from the front surface to the rear surface of the substrate.

Next, a method of fabricating the super junction MOSFET 100 according to Embodiment 2 will be described. First, a thin epitaxial layer is formed on an n-type semiconductor substrate which will be an $n^+$ drain layer 11. Then, n-type impurities are introduced into the entire thin epitaxial layer and thermal diffusion is performed to form an n-type low-impurity layer between the p-type region 2 and the $n^+$ drain layer 11. Then, an epitaxial layer forming a lower end portion 26 (26a and 26b) of a p-type low-concentration region 24 (FIG. 4) is formed on the entire surface of the n-type low-impurity layer, n-type impurities are introduced into the epitaxial layer, and thermal diffusion is performed. Then, a photoresist mask in which opening portions with different areas are formed such that a region for forming the lower end portion 26 (26a and 26b) of the p-type low-concentration region 24 has the curved stripe pattern illustrated in FIG. 4 is formed. Then, p-type impurity (boron) ions are implanted through the opening portions of the photoresist mask and thermal diffusion is performed. The lower end portion 26 (26a and 26b) of the p-type low-concentration region 24 which has the curved stripe pattern illustrated in FIG. 4 is formed by these processes. A region of the epitaxial layer into which the p-type impurities are not introduced is the n-type low-concentration region 22.

The photoresist mask for forming the lower end portion 26 (26a and 26b) of the p-type low-concentration region 24 has a curved stripe pattern having opening portions with different areas in which the width (the lateral width in FIG. 4) of the lower end portion 26 of the p-type low-concentration region 24 is partially large and a convex curve and a concave curve are repeated after thermal diffusion, as illustrated in FIG. 4. The planar pattern of the opening portions of the photoresist mask can be a stripe pattern in which rectangular concave and convex portions are repeated like the lower end portion 26 of the p-type low-concentration region 24 illustrated in FIG. 8, instead of a curved stripe pattern. When p-type impurity ions, such as boron ions, are implanted using the photoresist mask having the opening portions with different areas, the lower end portion 26 of the p-type low-concentration region 24 which has a stripe pattern including a high-concentration portion (high-concentration lower end portion 26a) with a large width and a low-concentration portion (low-concentration lower end portion 26b) with a small width can be efficiently formed by one ion implantation operation.

In FIG. 4, in the lower end portion of the parallel pn layer 20, a pitch $X_1$ between the concave and convex portions in the stripe pattern in which a wide portion (a convex portion: the high-concentration lower end portion 26a of the p-type low-concentration region 24) and a narrow portion (a concave portion: the low-concentration lower end portion 26b of the p-type low-concentration region 24) are alternately repeated is less than a pn pitch $X_2$ between the n-type region 1 and the p-type region 2 forming the parallel pn layer 20. In the case in which the pitch $X_1$ between the concave and convex portions is less than the pn pitch $X_2$ between the n-type region 1 and the p-type region 2, when a reverse bias is applied to the pn junction and the parallel pn layer 20 is depleted, the depletion layer is spread into the lower end portion 26 (26a and 26b) of the p-type low-concentration region 24 and is spread to the entire parallel pn layer 20, even though the lower end portion 26 of the p-type low-concentration region 24 having the stripe pattern in which the wide portion and the narrow portion are alternately repeated. Therefore, the effect of stabilizing the breakdown voltage is obtained. This effect is the same as that in Embodiment 1.

After the lower end portion 26 of the p-type low-concentration region 24 is formed, a portion other than the lower end portion 26 (26a and 26b) of the p-type low-concentration region 24, that is, a layer above the p-type region 2 (a portion of the p-type region 2 close to the front surface of the substrate) is formed. At that time, whenever an n-type epitaxial layer which will be the n-type low-concentration region 22 is formed, a process of selectively forming the p-type low-concentration region 24 in the n-type epitaxial layer using a photoresist mask having opening portions with the straight stripe pattern illustrated in FIG. 2 is repeatedly performed to form an epitaxial layer which will be the parallel pn layer 20. In addition, whenever an n-type epitaxial layer which will be the n-type high-concentration region 21 is formed, a process of selectively forming the p-type high-concentration region 23 in the n-type epitaxial layer using the photoresist mask having opening portions with the straight stripe pattern illustrated in FIG. 2 is repeatedly performed to form the epitaxial layer which will be the parallel pn layer 20. In this way, the parallel pn layer 20 with a predetermined thickness illustrated in FIG. 7 is formed.

When the parallel pn layer 20 illustrated in FIG. 7 is formed, n-type impurities are introduced into the n-type epitaxial layer, which will be the n-type high-concentration region 21, at an impurity concentration higher than the n-type impurity concentration of the n-type low-concentration region 22. In addition, p-type impurities are introduced into each n-type epitaxial layer, which will be the n-type low-concentration region 22, such that the impurity concentration of each p-type low-concentration region 24 formed in the n-type epitaxial layer increases gradually from the rear surface to the front surface of the substrate. Furthermore, p-type impurities are introduced into the n-type epitaxial layer forming the p-type high-concentration region 23 at an impurity concentration higher than the p-type impurity concentration of the p-type low-concentration region 24. Thermal diffusion may be performed whenever the epitaxial layer is grown. In addition, after the formation of the n-type epitaxial layer and the introduction of p-type impurities by ion implantation are repeatedly performed, a plurality of n-type epitaxial layers may be annealed and the p-type impurities may be thermally diffused.

Figure 8:
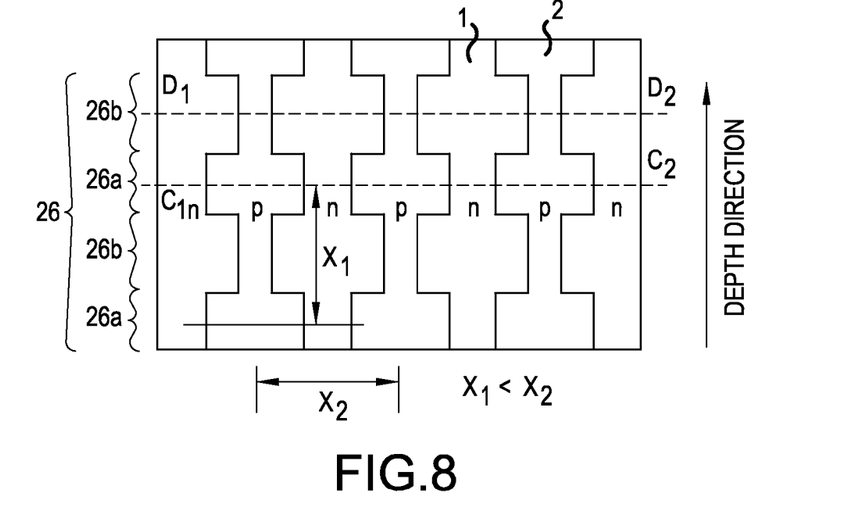
FIG. 8 is a plan view illustrating another example of a planar pattern in a cut surface when a lower end portion of a parallel pn layer illustrated in FIG. 7 is cut along the line $E_1$-$E_2$ parallel to the main surface of a substrate.

FIG. 8 is a plan view illustrating another example of the planar pattern in the cut surface when the lower end portion of the parallel pn layer illustrated in FIG. 7 is cut along the line $E_1$-$E_2$ parallel to the main surface of the substrate. FIG. 8 illustrates an uneven (or wide and narrow) stripe pattern of the lower end portion 26 (26a and 26b) of the p-type low-concentration region 24 in the depth direction of the plane of paper, which is different from the stripe pattern illustrated in FIG. 4. In the above-described Embodiments 1 and 2, the thermal diffusion process using ion implantation is used to form the lower end portion 26 of the p-type low-concentration region 24. Therefore, the uneven pattern of the lower end portion 26 of the p-type low-concentration region 24 is a curved pattern.

In contrast, in FIG. 8, in order to form the lower end portion 26 of the p-type low-concentration region 24, an n-type epitaxial layer which will be the n-type low-concentration region 22 is grown and a groove with a stripe pattern in which a rectangular concave portion and a rectangular convex portion illustrated in FIG. 8 are alternately arranged is formed in the n-type epitaxial layer by etching using, for example, a trench etching technique. Then, a p-type epitaxial layer which will be the lower end portion 26 of the p-type low-concentration region 24 is formed so as to fill the groove. Since the impurity concentration of a wide portion (convex portion) of the groove is likely to be higher than the impurity concentration of a narrow portion (concave portion), the p-type epitaxial layer which is buried in the wide portion of the groove can be the high-concentration lower end portion 26a of the p-type low-concentration region 24 which has a higher impurity concentration than the p-type epitaxial layer buried in the narrow portion of the groove.

As described above, according to Embodiment 2, similarly to Embodiment 1, a portion with high p-type impurity concentration into which the avalanche current starts to flow is not provided in the entire p-type region of the parallel pn layer, but is selectively provided in the p-type region of the parallel pn layer. According to this structure, the path of the avalanche current along the parallel pn junction reaches the source electrode through the vicinity of a portion which is arranged immediately below the source region provided immediately above the p-type region and an area ratio for operating a parasitic bipolar transistor is reduced. Therefore, it is possible to improve avalanche resistance. As a result, the trade-off relationship between turn-off loss and turn-off dv/dt is improved, as compared to the MOSFET according to the related art. It is possible to improve avalanche resistance, as compared to the super junction MOSFET according to the related art.

The invention is not limited to the above-described embodiments, but various modifications and changes of the invention can be made without departing from the scope and spirit of the invention. In addition, in the invention, the conductivity types may be reversed. In this case, the same effect as described above is obtained.

INDUSTRIAL APPLICABILITY

As described above, the semiconductor device and the semiconductor device fabrication method according to the invention are useful for a high-power super junction MOS semiconductor device that is used in, for example, a switching circuit and are particularly suitable for a super junction MOS semiconductor device with a high breakdown voltage and high current capacity, such as a super junction MOSFET or a super junction IGBT.

Thus, a semiconductor device and a semiconductor device fabrication method have been described according to the present invention. An n⁻ drift layer that is provided between a first main surface of a first-conductivity-type semiconductor substrate on which a MOS gate structure is formed and a second main surface opposite to the first main surface is a parallel pn layer (20) having the following structure: an n-type region (1) and a p-type region (2), in which a width in a direction parallel to the main surface of the substrate is less than a length in a direction perpendicular to the main surface of the substrate, are alternately arranged in the direction parallel to the main surface of the substrate so as to come into contact with each other; and a pn junction between the n-type region (1) and the p-type region (2) is arranged in the direction perpendicular to the main surface of the substrate. A second-main-surface-side lower end portion (26) of the p-type region (2) has a structure in which a high-concentration lower end portion and a low-concentration lower end portion of a p-type low-concentration region are repeated at a predetermined pitch in the direction parallel to the main surface of the substrate. Therefore, it is possible to provide a super junction MOS semiconductor device which can improve a trade-off relationship between turn-off loss and turn-off dv/dt and improve avalanche resistance.

Many modifications and variations may be made to the techniques and structures described and illustrated herein without departing from the spirit and scope of the invention. Accordingly, it should be understood that the devices and methods described herein are illustrative only and are not limiting upon the scope of the invention.

EXPLANATIONS OF LETTERS OR NUMERALS 1 n-type region
2 p-type region
3 p base region
4 n-type surface region
5 p⁺ collector region
6 n⁺ source region
7 gate insulating film
8 gate electrode
9 interlayer insulating film
10 source electrode
11 n⁺ drain layer
12 drain electrode
20 parallel pn layer
21 n-type high-concentration region
22 n-type low-concentration region
23 p-type high-concentration region
24 p-type low-concentration region
26 lower end portion of p-type low-concentration region
26a high-concentration lower end portion of p-type low-concentration region
26b low-concentration lower end portion of p-type low-concentration region

What is claimed is:

1. A semiconductor device comprising:
an insulated gate structure that is provided on a first main surface of a first-conductivity-type semiconductor substrate; and
a drift layer that is provided between the first main surface of the first-conductivity-type semiconductor substrate and a second main surface opposite to the first main surface,
wherein the drift layer is a parallel pn layer including a first-conductivity-type region in which a width in a direction parallel to the first main surface is less than a length in a direction perpendicular to the first main surface and a second-conductivity-type region in which a width in the direction parallel to the first main surface is less than a length in the direction perpendicular to the first main surface, wherein a planar pattern of the drift layer under the insulated gate structure is a stripe pattern,
the first-conductivity-type region and the second-conductivity-type region are alternately arranged in the direction parallel to the first main surface so as to come into contact with each other,
a pn junction between the first-conductivity-type region and the second-conductivity-type region extends in the direction perpendicular to the first main surface, and
a second-conductivity-type second-main-surface-side region having an impurity concentration distribution in which high impurity concentration and low impurity concentration are repeated at a predetermined pitch in the direction parallel to the first main surface, the second-conductivity-type second-main-surface-side region contacting an end of the second-conductivity-type region that is closest to the second main surface,
wherein the second-conductivity-type second-main-surface-side region includes: a second-main-surface-side high-concentration region having a higher impurity concentration than the concentration at a bottom of the second-conductivity-type region and a second-main-surface-side low-concentration region having a lower impurity concentration than the concentration at the bottom of the second-conductivity-type region,
wherein the second-main-surface-side high-concentration region and the second-main-surface-side low-concentration region are alternately and continuously arranged in a longitudinal direction of the stripe pattern under the insulated gate structure.

2. The semiconductor device according to claim 1, wherein:
   the second-main-surface-side high-concentration region has a larger width than the second-conductivity-type region in the first direction; and
   the second-main-surface-side low-concentration region has a smaller width than the second-conductivity-type region in the first direction.

3. The semiconductor device according to claim 1, wherein the predetermined pitch is less than a pitch between the first-conductivity-type region and the second-conductivity-type region.

4. The semiconductor device according to claim 2, wherein the predetermined pitch is less than a pitch between the first-conductivity-type region and the second-conductivity-type region.

5. The semiconductor device according to claim 1, wherein the impurity concentration of the high-concentration region is equal to or greater than 1.2 times the impurity concentration of the low-concentration region and equal to or less than three times the impurity concentration of the low-concentration region.

6. The semiconductor device according to claim 5, wherein the impurity concentration of the high-concentration region is equal to or less than 2.5 times the impurity concentration of the low-concentration region.

7. A method for fabricating the semiconductor device according to claim 2, comprising:
   a forming step of performing ion implantation using a mask having a stripe-shaped opening portion which extends in the second direction to form the second-main-surface-side region,
   wherein the opening portion of the mask has a stripe pattern in which a first opening portion that exposes a portion corresponding to a region for forming the second-main-surface-side high-concentration region and a second opening portion that expose a portion corresponding to a region for forming the second-main-surface-side low-concentration region and has a smaller opening area than the first opening portion are alternately arranged in an extension direction of the stripe.

* * * * *